(12) United States Patent
Chen et al.

(10) Patent No.: US 10,145,896 B2
(45) Date of Patent: Dec. 4, 2018

(54) ELECTRONIC DEVICE, PERFORMANCE BINNING SYSTEM AND METHOD, VOLTAGE AUTOMATIC CALIBRATION SYSTEM

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Shi-Hao Chen, Nantou County (TW); Yung-Sheng Fang, Kaohsiung (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 589 days.

(21) Appl. No.: 14/695,033

(22) Filed: Apr. 23, 2015

(65) Prior Publication Data

US 2015/0226790 A1 Aug. 13, 2015

Related U.S. Application Data

(63) Continuation-in-part of application No. 13/959,764, filed on Aug. 6, 2013, now Pat. No. 9,244,122.

(30) Foreign Application Priority Data

Aug. 1, 2014 (TW) .............................. 103126423 A

(51) Int. Cl.
 *G01R 31/317* (2006.01)

(52) U.S. Cl.
 CPC .. *G01R 31/31725* (2013.01); *G01R 31/31718* (2013.01)

(58) Field of Classification Search
 CPC .............. G01R 31/31725; G01R 31/28; G01R 31/2834; G01R 31/308; G06F 1/08;
 (Continued)

(56) References Cited

U.S. PATENT DOCUMENTS 7,915,910 B2 3/2011 von Kaenel
9,158,319 B2* 10/2015 Gowda .................. G05F 1/465
 (Continued)

FOREIGN PATENT DOCUMENTS

TW 200905463 A 2/2009
TW I380265 12/2012
TW I383356 1/2013

*Primary Examiner* — Tan T. Nguyen
(74) *Attorney, Agent, or Firm* — CKC & Partners Co., Ltd.

(57) ABSTRACT

A method for determining performance of an integrated circuit (IC) is disclosed herein. The method includes following operations: disposing hardware performance monitors (HPMs) in each of ICs, in which each of HPMs generates a value for generating the performance of the IC; providing a performance function including of terms according to values generated by the HPMs, in which a weight is associated with each of terms; determining the weight of each of terms according to a first set of ICs of the ICs, wherein the performance of each of the ICs is known; and determining the performance of a first ICs of the ICs according to the performance function, wherein the performance function and the weights are built into the first ICs.

3 Claims, 8 Drawing Sheets

(58) Field of Classification Search
CPC .... G06F 11/3024; G06F 11/3062; G06F 1/04; G06F 1/3206; H04B 2001/71365; H03L 1/00
USPC ............................. 702/117, 118, 181, 182
See application file for complete search history.

(56) References Cited

U.S. PATENT DOCUMENTS

| | | |
|---|---|---|
| 2006/0259840 A1 | 11/2006 | Abadeer et al. |
| 2009/0096495 A1* | 4/2009 | Keigo ................. G01K 7/01 327/142 |
| 2011/0101998 A1* | 5/2011 | Myers ............... G01R 31/2621 324/678 |
| 2013/0311799 A1* | 11/2013 | Fitzpatrick ........... G06F 1/3296 713/320 |

* cited by examiner

ELECTRONIC DEVICE, PERFORMANCE BINNING SYSTEM AND METHOD, VOLTAGE AUTOMATIC CALIBRATION SYSTEM

RELATED APPLICATIONS

The present application is a continuation-in-part application of U.S. application Ser. No. 13/959,764, filed Aug. 6, 2013 and claims priority to Taiwan Application Serial Number 103126423, filed Aug. 1, 2014, which is herein incorporated by reference.

BACKGROUND

Technical Field

The disclosure relates in general to test an integrated circuit and, in particular, to bin the performance of the integrated circuit.

Description of Related Art

Conventionally, function and AC scan patterns are used to test the functionalities and the performance of an integrated circuit. That is, functional and AC patterns are used to verify the correctness and operating speed of the chip, wherein a clocking speed is fed into the chip along with the patterns.

FIG. 1 illustrates a conventional flow of correlating actual speed of a chip with functional test patterns. In step 101, the chip is tapped out after all the design has been layout and verified. In step 102, after the chip is fabricated, post-silicon testing and data can be collected for further analyses. In step 103, the correlation between the performance of the chip and the functional/AC-Scan patterns can be determined. In step 104, performance binning using the above-mentioned correlation can be performed. However, it's costly and time consuming to correlate the actual speed with a large number of functional/AC patterns.

In another aspect of the conventional method, critical paths of a chip are observed to obtain the delay of the critical paths so as to determine the performance of the chip. However, thousands of paths may become candidates of critical paths in the post-silicon stage. A single ROSC (Ring Oscillator) or duplicated critical path is not effective to correlate so many critical paths varying in the post-silicon stage. Consequently, it is not an efficient way to correlate the actual speed with critical paths of a chip.

Therefore, what is needed is an effective and efficient way to determine the performance, or speed, of a chip.

SUMMARY

One aspect of the present disclosure is to provide a method of determining the performance of an integrated circuit. The method includes: disposing HPM(s) (hardware performance monitor) in each of the integrated circuits, in which each HPM generates a value for generating the performance of the integrated circuit; providing a performance function including terms according to values generated by the plurality of HPM(s), in which a weight is associated with each term of the performance function; determining the weight of each term according to a first set of integrated circuits of the integrated circuits, in which the performance of each of the first set of integrated circuits is known; and determining the performance of each of first integrated circuits of the integrated circuits according to the performance function, in which the performance function and the weights are built into each of the first integrated circuits.

One aspect of the present disclosure is to provide an apparatus for determining the performance of an integrated circuit of integrated circuits. The apparatus includes HPM(s) (hardware performance monitor) in the integrated circuits, a storage unit, and a built-in self-test (BIST) module. Each HPM is configured to generate a value for generating the performance of the integrated circuit. The storage unit is configured to store weights of a performance function having terms according to the values generated by the HPM(s), in which each term of the performance function is respectively associated with a corresponding weight of the weights, the weight of each term is determined according to a first set of integrated circuits of the integrated circuits, and the performance of each of the first set of integrated circuits is known. The BIST module is configured to determine the performance of one of the integrated circuits by obtaining a value of the performance function according to the values of the HPM(s) and the weights in the storage unit.

One aspect of the present disclosure is to provide a circuitry system. The circuitry system includes integrated circuits, HPM(s) (hardware performance monitor) disposed in the integrated circuits, a storage unit, and a BIST module. Each HPM is configured to generate a value for generating the performance of the integrated circuit. The storage unit is configured to store weights of a performance function having terms according to the values generated by the HPM(s), in which each term of the performance function is respectively associated with a corresponding weight of the weights, the weight of each term is determined according to a first set of integrated circuits of the integrated circuits, and the performance of each of the first set of integrated circuits is known. The BIST module is configured to determine the performance of one of the integrated circuits by obtaining a value of the performance function according to the values of the HPM(s) and the weights in the storage unit.

One aspect of the present disclosure is to provide a circuitry system to bin the aforementioned circuitry system. The binning system includes an interface coupled to the circuitry system to obtain the performance of the integrated circuits.

One aspect of the present disclosure is to provide a voltage automatic calibration system for the aforementioned apparatus. The voltage automatic calibration system includes a power management module and a voltage adjustment module. The power management module is configured to generate a driving voltage to drive the integrated circuits according to a control signal. The voltage adjustment module is electrically coupled to the power management module, and is configured to generate the control signal by comparing the value of the performance function and a target value.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
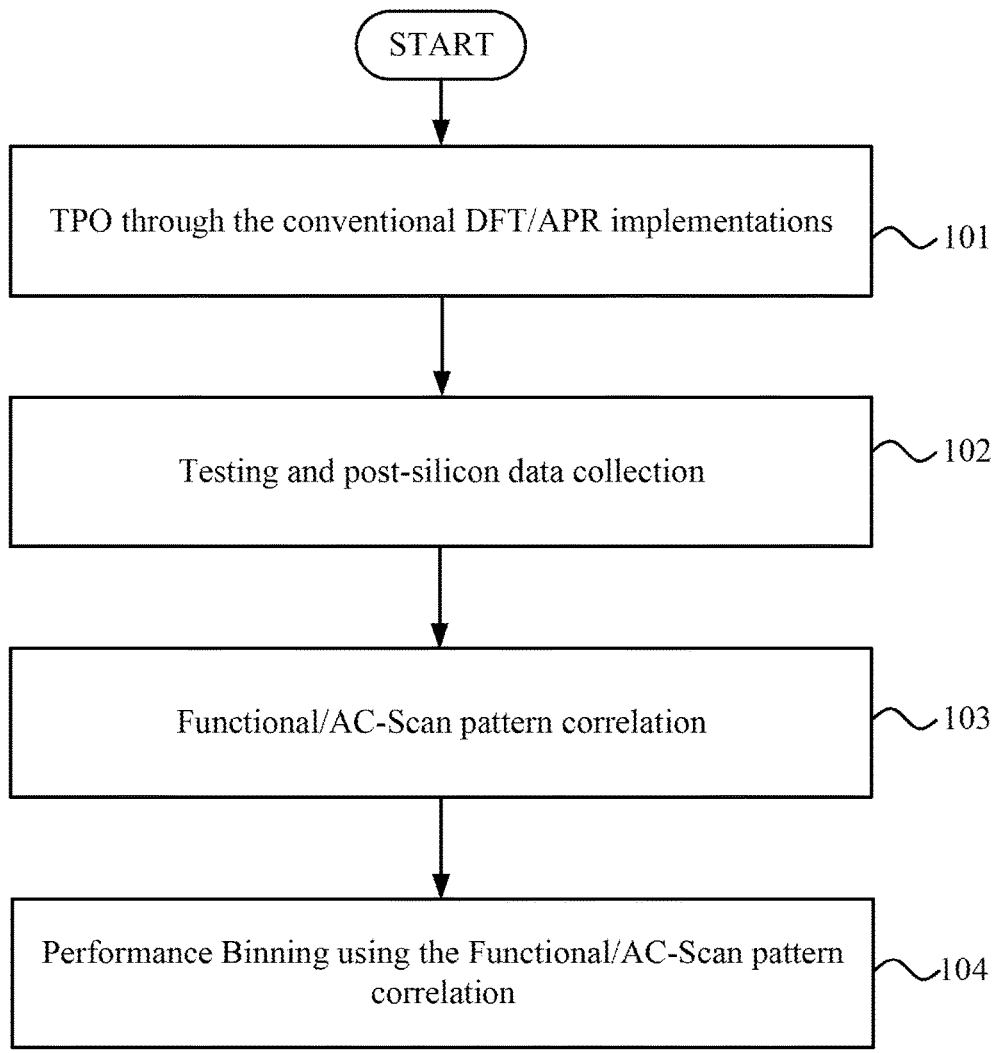
FIG. 1 illustrates a conventional flow of correlating actual speed of a chip with functional test patterns.

Reference will now be made in detail to the present embodiments of the disclosure, examples of which are illustrated in the accompanying drawings. Wherever possible, the same reference numbers are used in the drawings and the description to refer to the same or like parts.

Figure 2:
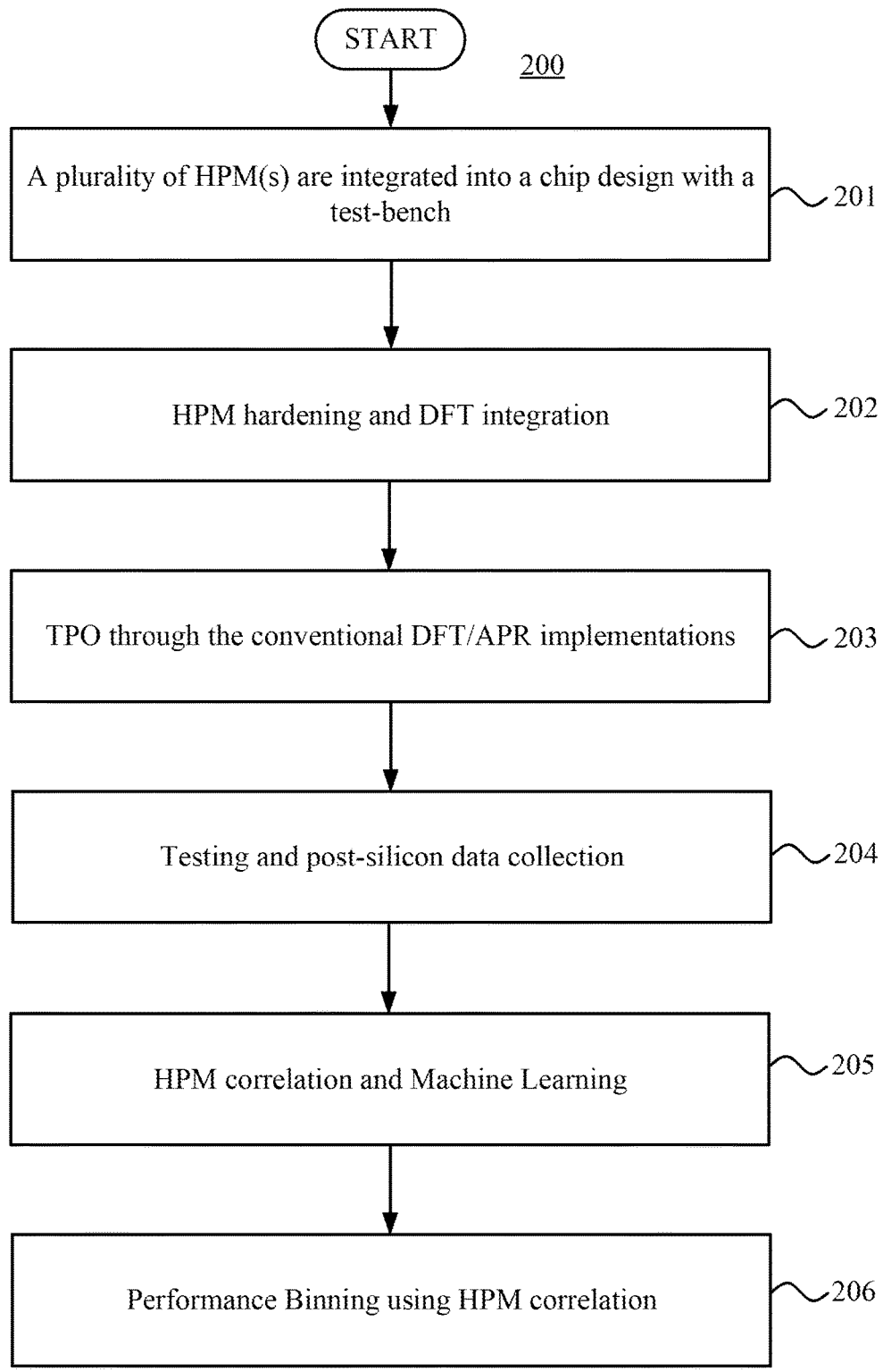
FIG. 2 illustrates a flow chart of using HPM(s) in a chip to do performance binning automatically through a built-in self-test (BIST) module inside the chip.

FIG. 2 illustrates a flow chart of using HPM(s) in a chip to do performance binning automatically through a built-in self-test (BIST) module inside the chip. In step 201, pluralities of HPM(s) are integrated into a chip design with a test-bench to verify the integration, which can be compiled by a HPM complier. In step 202, HPM(s) hardening and OFT integration can be performed. In step 203, the chip can be tapped out after all the design has been layout and verified. In step 204, after the chip is fabricated, post-silicon testing and HPM(s) data can be collected for further analyses. In step 205, HPM(s) data and performance correlation can be determined by a set of sample chips, in which each of the sample chip has a known performance using methods such as in circuit emulations or static timing analyses based on a SDF (Standard Delay Format) construction imitating the OCV (On-Chip Variation) influence based on the HPM(s) data generated from real silicon, the correlation can be represented by a performance function to predict the performance of an integrated circuit through machine learning technique using linear or polynomial regressions to derive the performance function according to the correlations between the HPM(s) data and performances of the sample chips. Please note that sample chips can be randomly selected from different runs or batches fabricated from the foundry. Each term of the performance function has a weighting factor that can be determined according to the correlations of the data generated by the HPM(s) and the known performance of the sample chips. In step 206, based on the data from the HPM(s) and the weighting factors associated with the data of HPM(s), each chip can evaluate its own performance by integrating the performance function into each chip.

In some conditions, the number of HPM(s), the locations of the HPM(s) and each term of the performance function can be adjusted to represent the true performance of the chip as needed. After the performance function is finalized and integrated into the chips, a self-binning system can be provided to bin all the chips into multiple grades of performance automatically to save time and cost. By using the method of present disclosure, post-silicon tuning and PVT compensation can be performed to increase the yield of the chips as well. In addition, the method of present disclosure can be used for the refinement of timing sign-off methodology.

In one embodiment, each HPM includes a counting circuit to generate a counter value indicating the frequency of a signal of the integrated circuit, and the performance function is expressed as $f(x)=w_0+w_{11}x_1+w_{12}x_1^2+w_{21}x_2+w_{22}x_2^2+ \ldots +w_{n1}x_n+w_{n2}x_n^2$, in which each of the $x_1, x_2, \ldots,$ and $x_n$ corresponds to a counter value of a HPM, respectively. In one embodiment, each HPM includes a ring oscillator. The above performance function is given only for illustrative purpose, and the present disclosure is not limited to a particular form of a performance function. For illustration, the term of f(x) can include higher order of counter values, such as $x^3$ or $x^4$, to match the true performance or speed of the chip. In one embodiment, the performance is the operating frequency of the integrated circuit.

In one embodiment, an apparatus for determining the performance of an integrated circuit of integrated circuits is disclosed. The apparatus includes HPM(s) (hardware performance monitor) in the integrated circuits, a storage unit, and a built-in self-test (BIST) module. Each HPM is configured to generate a value for generating the performance of the integrated circuit. The storage unit is configured to store weights of a performance function having terms according to the values generated by the HPM(s), in which each term of the performance function is respectively associated with a corresponding weight of the weights, the weight of each term is determined according to a first set of integrated circuits of the integrated circuits, and the performance of each of the first set of integrated circuits is known. The BIST module is configured to determine the performance of one of the integrated circuits by obtaining a value of the performance function according to the values of the HPM(s) and the weights in the storage unit.

In one embodiment, the apparatus described above, the performance of an integrated circuit includes the operating frequency of the integrated circuit, wherein each HPM generate counter value indicating the frequency of a signal of the integrated circuit. In one embodiment, the integrated circuit includes a joint test action group (JTAG) port which is electrically connected to the BIST module to communicate with a self-binning system. In one embodiment, each HPM comprises a ring oscillator to generate a counter value indicating the frequency of the ring oscillator.

Figure 3A:
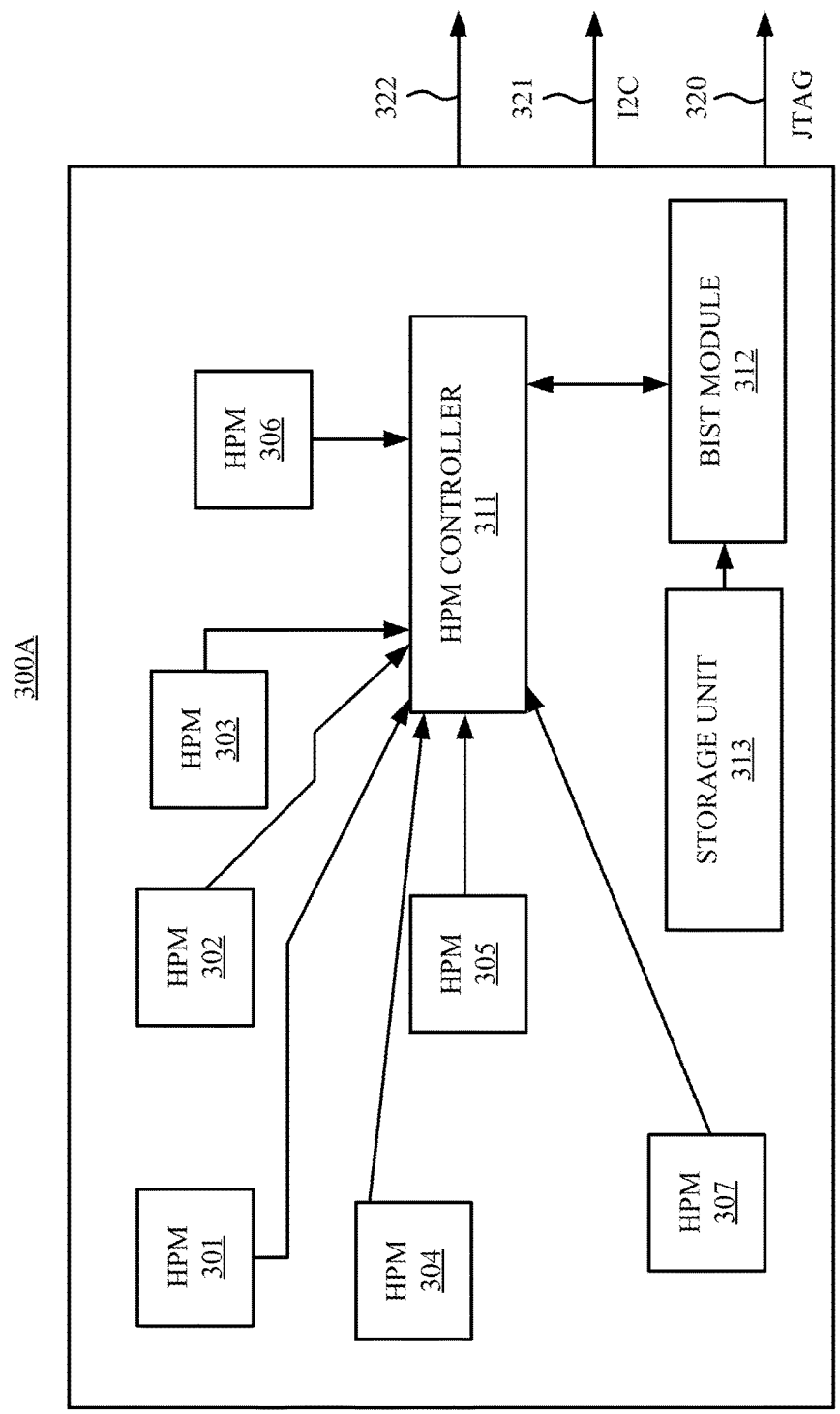
FIG. 3A is a schematic diagram of a chip according to one embodiment of the present disclosure.

FIG. 3A is a schematic diagram of a chip according to one embodiment of the present disclosure. As shown in FIG. 3A, the chip 300A utilizes a controller and HPM(s) coupled to the BIST module in parallel to automatically determine the speed of the chip. As shown in FIG. 3A, HPM(s) 301, 302, 303, 304, 305, 306, 307 are disposed in the chip and connected to a HPM controller 311 in parallel. In each HPM, there is a counter to record the activities of the signals such as the frequency of a signal generated from a ring oscillator to indicate the performance of a local region where the HPM is located. In addition, there is a storage unit 313 to store a decision table. The decision table includes all the weighting factors corresponding to the counter values respectively. A BIST module 312 can be integrated to the chip to communicate with the controller to determine the performance or speed of the chip. A chip bus, such as JTAG bus 320 or I2C bus 321, can be used to communicate with an external system such as a binning system to bin the chips into multiple grades of speed. The output of the chip performance or speed can be merged with a chip bus, such as JTAG bus 320 or I2C bus 321, or carried on an independent performance bus 322.

Figure 3B:
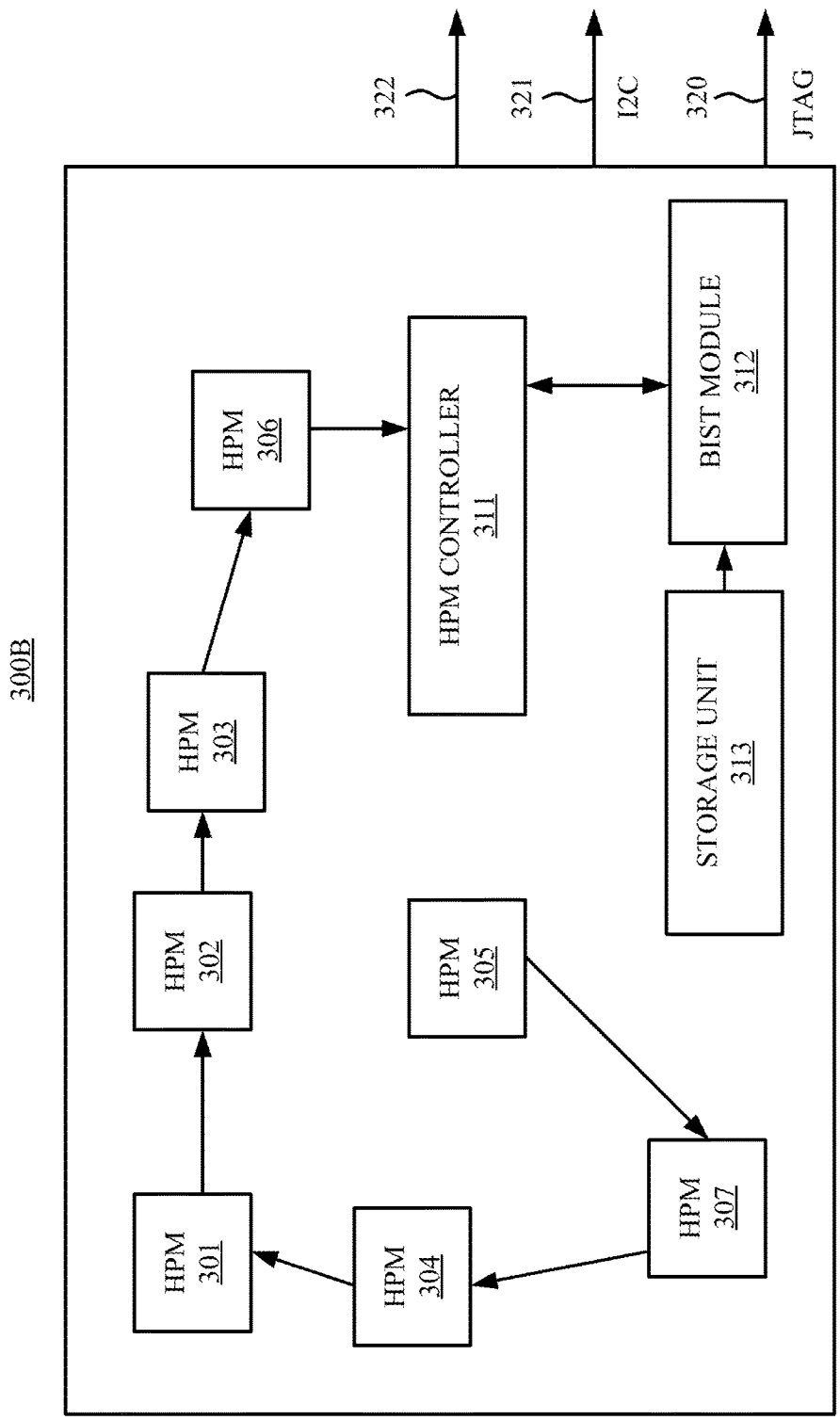
FIG. 3B is a schematic diagram of a chip according to one embodiment of the present disclosure.

FIG. 3B is a schematic diagram of a chip according to one embodiment of the present disclosure. The chip 300B shown in FIG. 3B utilizes a controller and HPM(s) coupled to the BIST module in series to automatically determine the speed of the chip 300B. As shown in FIG. 3B, the HPM(s) 301, 302, 303, 304, 305, 306, 307 are disposed in the chip 300B and connected to a HPM controller 311 in series. In each HPM, there is a counter to record the activities of the signals such as the frequency of a signal generated from a ring oscillator to indicate the performance of a local region where the HPM is located. In addition, there is a storage unit 313 to store a decision table that includes all the weights corresponding to the counter values respectively. A BIST module 312 can be integrated to the chip to communicate with the controller 311 to determine the performance or speed of the chip 300B. A chip bus, such as JTAG bus 320 or I2C bus 321, can be used to communicate with an external system such as a binning system to bin the chips into multiple grades of speed. The output of the chip performance or speed can be merged with a chip bus, such as JTAG bus 320 or I2C bus 321, or carried on an independent performance bus 322.

From above description, the values corresponding to the performance of different locations of the chip can be determined by disposing the HPM(s) on the different locations of the chip. The average performance of the chip can further be obtained by the controller and the BIST module. Accordingly, the variations, the affect of parasitic capacitances, and/or the affect of parasitic resistances on the different locations of the chip can be considered in the determination of the performance of the chip. Thus, a much accurate and a much real value corresponding to the performance of the chip can be obtained.

TABLE 1

| Weights | HPM counter values |
|---|---|
| $w_{11}$, $w_{12}$ | $x_1$ |
| $w_{21}$, $w_{22}$ | $x_2$ |
| . | . |
| . | . |
| . | . |
| $W_{n1}$, $W_{n2}$ | $x_n$ |

Table 1 is a decision table which can be a programmable decision table (PDT) of the chip used in FIG. 3A and FIG. 3B. In one embodiment, the performance function can be expressed as: $f(x)=w_0+w_{11}x_1+w_{12}x_1^2+w_{21}x_2+w_{22}x_2^2+ \ldots +w_{n1}x_n+w_{n2}x_n^2$, in which each of the $x_1, x_2, \ldots,$ and $x_n$ corresponds to a counter value of each of the HPM counters respectively, $w_0$ is a constant and $w_{11}$, $w_{12}$, $w_{21}$, $w_{22}$, ..., $w_{n1}$, $w_{n2}$ are coefficients of terms in the performance function, respectively. A BIST module obtains a value of the performance function according to the counter values of the HPM(s) and the coefficients stored in the programmable decision table. The programmable decision table can be stored in a memory device such as a flash memory.

Figure 4:
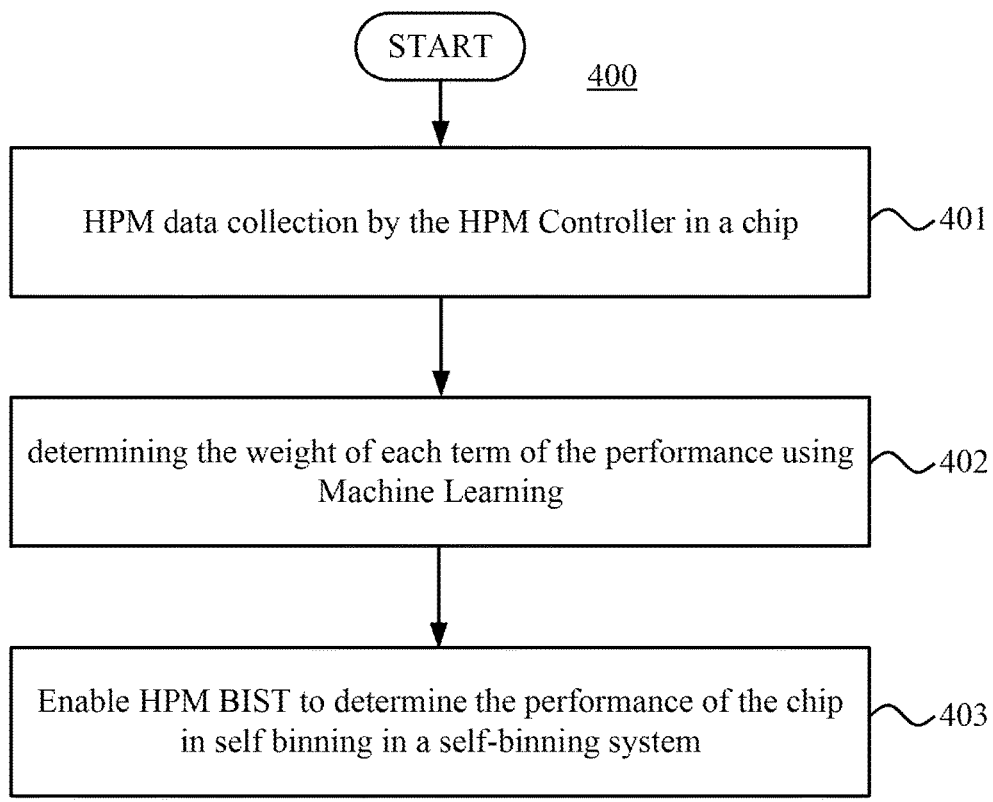
FIG. 4 is a flow chart of an algorithm according to one embodiment of the present disclosure.

FIG. 4 is a flow chart of an algorithm according to one embodiment of the present disclosure. The algorithm 40 can be applied to generate the performance of the chip shown in FIGS. 3A and 3B. In step 401, HPM data are collected by the HPM controller. In step 402, a performance function is used to obtain the performance or speed of the chip. After the coefficients are determined through a set of sample chips using machine learning technique, the coefficients can be written back to a programmable decision table inside the chip. In step 403, an HPM-BIST module of the chip can be enabled to classify the performance or speed of the chip automatically in a self-binning system.

Figure 5:
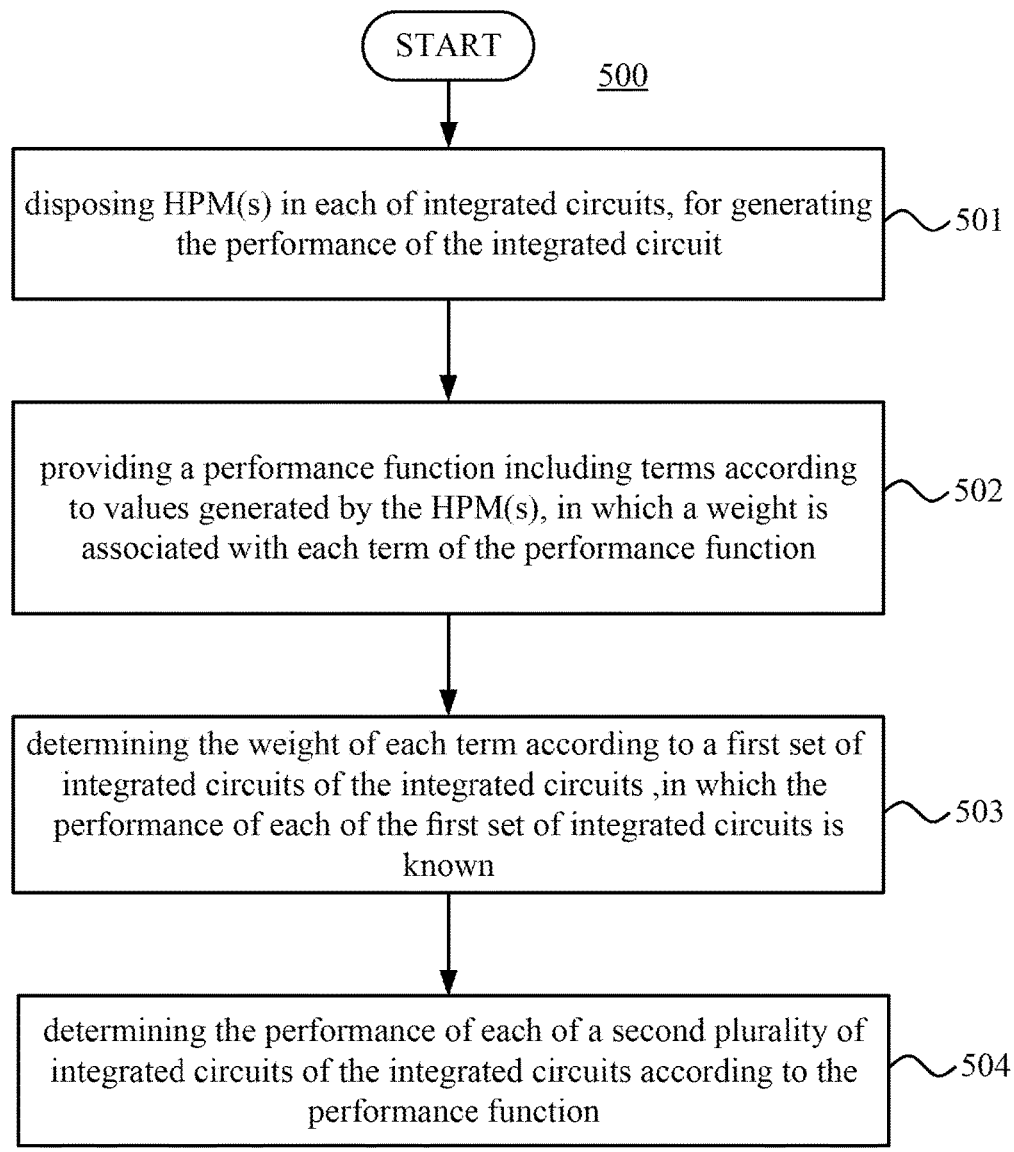
FIG. 5 is a flow chart of a method for determining the performance of the integrated circuits according to one embodiment of the present disclosure.

FIG. 5 is a flow chart of a method for determining the performance of the integrated circuits according to one embodiment of the present disclosure. In step 501, HPM(s) (hardware performance monitor) are disposed in each of integrated circuits to generate the performance of the integrated circuits. In step 502, a performance function including terms is provided according to values of the HPM(s) in which a weight is associated with each term of the performance function. In step 503, the weight of each term is determined according to a first set of integrated circuits of the integrated circuits, in which the performance of each of the first set of integrated circuits is known. In step 504, the performance of second integrated circuits of the integrated circuits is determined according to the performance function based on the counter value of the HPM(s) in the integrated circuit and weights associated with the counter values.

In one embodiment, a circuitry system includes integrated circuits; HPM(s) disposed in the integrated circuits, in which each HPM is configured to generate a value for generating the performance of the integrated circuit; a storage unit configured to store weights of a performance function according to the values generated by the HPM(s); and a BIST module configured to determine the performance of one of the integrated circuits by obtaining a value of the performance function according to the values of the HPM(s) and the weights in the storage unit. The performance function includes terms, in which each term of the performance function is respectively associated with a corresponding weight of the weights. The weight of each term is determined according to a first set of integrated circuits of the integrated circuits, and the performance of each of the first set of integrated circuits is known. In one embodiment, the circuitry system includes a JTAG port to output the maximum operating frequency of the integrated circuits.

In one embodiment, a binning system for binning integrated circuits into grades of performance is disclosed, in which each of the integrated circuits has the apparatus for determining the performance of an integrated circuit of the integrated circuits. The binning system includes: an interface coupled to the integrated circuits to obtain the performance of the integrated circuits through the apparatus of the integrated circuits, and is configured to bin the integrated circuits into grades of performance. After the integrated circuits are binned into multiple grades of performance or speeds, an operation voltage of the integrated circuits can be adjusted higher, so that the integrated circuits can meet the performance or speed specification or requirements for applications.

Please note that although the above embodiments uses an integrated circuit (IC) or a chip as examples, present disclosure can be used in die to die, wafer to wafer sorting or any other sizes of integrated circuits.

Figure 6A:
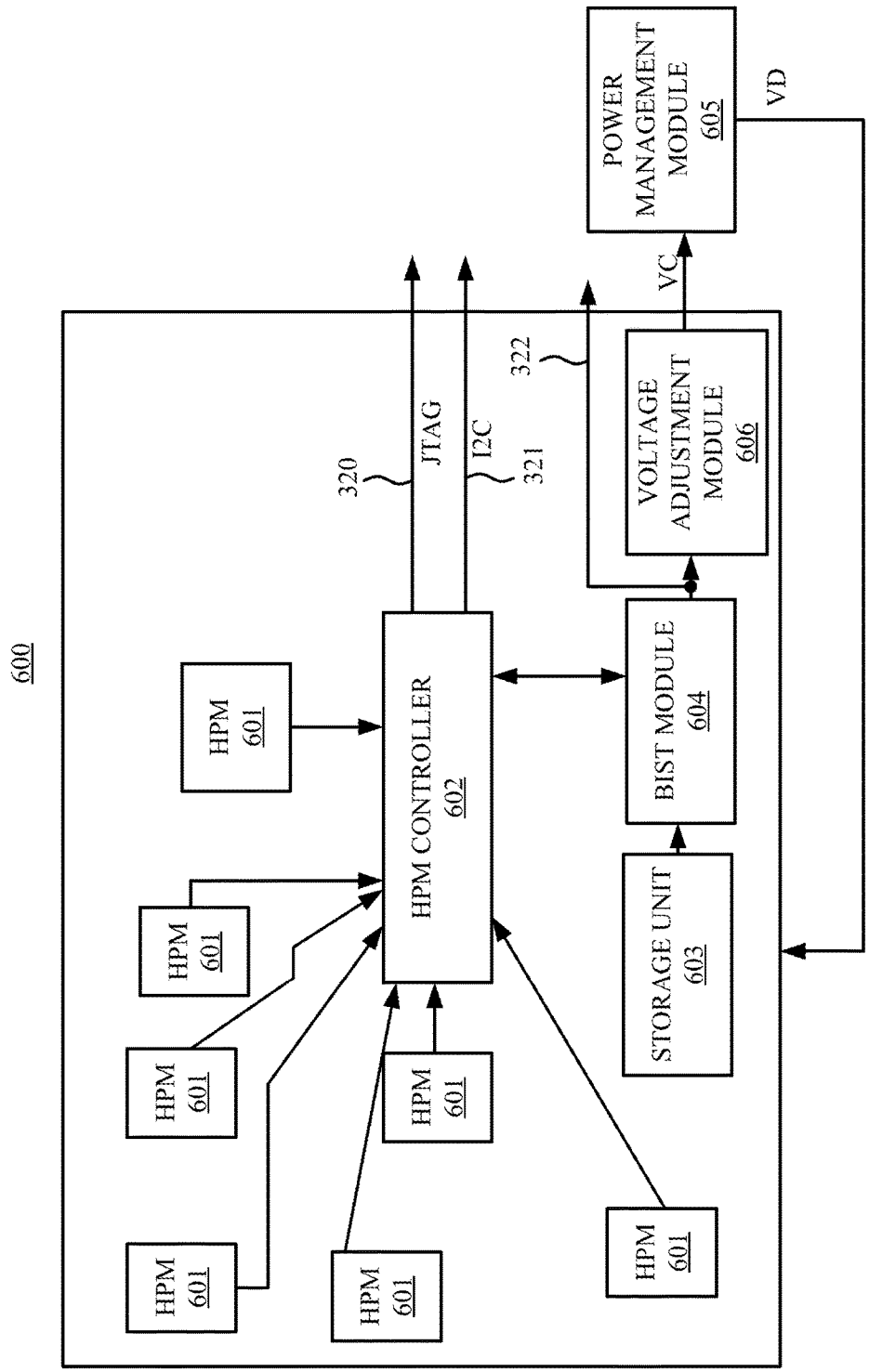
FIG. 6A is a schematic diagram of a voltage automatic calibration system according to one embodiment of the present disclosure.

FIG. 6A is a schematic diagram of a voltage automatic calibration system according to one embodiment of the present disclosure. The voltage automatic calibration system can be applied to the chip 300A shown in FIG. 3A or the chip 300B shown in FIG. 3B. FIG. 6A illustrated with the chip 300A, the voltage automatic calibration system 600 includes HPM(s) 601 disposed in the chip, a HPM controller 602, a storage unit 603, a BIST module 604, an I2C bus 321, a JTAG bus 320, a performance bus 322, a power management module 605, and a voltage adjustment module 606. The functions and arrangements of the HPM(s) 601, the HPM controller 602, the storage unit 603, the BIST module 604, the I2C bus 321, the JTAG bus 320, and the performance bus 322 are similar with the embodiment shown in FIG. 3A, and the repetitious descriptions are not given here.

As shown in FIG. 6A, the chip 300A can be driven by the driving voltage VD generated from the power management module 605. In one embodiment, the power management module 605 includes a power management chip, and the power management chip can generate the driving voltage VD according to a control signal VC.

The voltage adjustment module 606 is electrically coupled to the power management module 605, and is configured to generate the control signal VC by comparing the counter value of the performance function and a target value. Thus, the desired performance can be obtained by adjusting the target value. In other words, the integrated circuits can achieve the desired performance by adjusting the driving voltage VD with the control signal VC.

TABLE 2

| Performance | Voltage | | | | | | |
|---|---|---|---|---|---|---|---|
| | 0.825 | 0.85 | 0.875 | 0.9 | 0.925 | 0.95 | 0.975 |
| Better | 622 | 656 | 696 | 720 | 766 | 811 | 854 |
| ↓ | 597 | 631 | 667 | 690 | 729 | 785 | 826 |
| Worse | 539 | 583 | 621 | 660 | 703 | 741 | 789 |
| | 514 | 863 | 605 | 630 | 677 | 703 | 748 |
| | 487 | 533 | 575 | 600 | 649 | 692 | 734 |
| | 452 | 497 | 532 | 570 | 607 | 655 | 687 |

Table 2 is a performance table according to one embodiment of the present disclosure. In operation, after the HPM(s) 601 are enabled, the counter value corresponding to the performance of the chip can be automatically generated by performing calculation with the performance function. The, the performance table (i.e., table 2) is built by sampling a certain number of counter values. Table 2 records the counter values corresponding to the performance of the chip under different driving voltages VD. In general, as illustrated in table 2, when the driving voltage VD is higher, the speed or the performance of the chip is greater, and the corresponding counter value is higher. In practical applications, the performance table can be corrected with a certain number of the chips when the performance table is initially built.

Moreover, to maintain the performance of the fabricated chips being a desired value, the voltage adjustment module 606 is able to increase the driving voltage VD of the chips being lack of performance, and to decrease the driving voltage VD of the chips being excess of performance. Thus, the unwanted power consumption can be saved.

For illustration, it's assumed that the table 2 is verified that the chips can be operated at 1.5 GHz frequency under different voltages VD when the counter value is greater than 660. After the chips are fabricated, the initial driving voltage VD is set to 0.9 Volts, and the target value is set to 660. In other words, the chips are expected to operate at 1.5 GHz frequencies.

After one of the chips (hereinafter recited as Chip A) is enabled with the driving voltage VD being 0.9 Volts, the corresponding counter value determined by the BIST module is 704. The voltage adjustment module 606 learns that the counter value 704 is greater than the target value 660 according to table 2 (i.e., the performance table), and thus the voltage adjustment module 606 decreases the driving voltage VD generated from the power management module 605 to the 0.875 Volts. In this time, with the driving voltage VD being 0.875 Volts, the corresponding counter value determined by the BIST module is 681. The voltage adjustment module 606 learns that the counter value 681 is greater than the target value 660 according to table 2 (i.e., the performance table), and the counter value 660 is not presented in the case of the driving voltage VD being at 0.85 Volts in the table 2. Thus, the voltage adjustment module 606 determines to set the driving voltage to 0.875 Volts.

Similarly, after another one of the chips (hereinafter recited as Chip B) is enabled with the driving voltage VD being 0.9 Volts, the corresponding counter value determined by the BIST module is 604. The voltage adjustment module 606 learns that the counter value 604 is less than the target value 660 according to table 2, and thus the voltage adjustment module 606 increases the driving voltage VD generated from the power management module 605 to do 0.95 Volts. In this time, with the driving voltage VD being 0.95 Volts, the corresponding counter value determined by the BIST module is 695. The voltage adjustment module 606 learns that the counter value 695 is greater than the target value 660 according to table 2, and the chip B can stably operate at 1.5 GHz frequency in the case of the driving voltage VD being at 0.95 Volts. Thus, the voltage adjustment module 606 determines to set the driving voltage to 0.95 Volts.

In one embodiment, the performance table and the weights of the performance function can be stored in the storage unit 603. The storage unit 603 includes a programmable decision table (PDT), a flash memory, or a one time program (OTP) memory. The voltage adjustment module 606 can also be integrated to the chips (integrated circuits), and the voltage adjustment module 606 includes a microcontroller, a digital circuit, etc, and the present disclosure is not limited thereto.

Figure 6B:
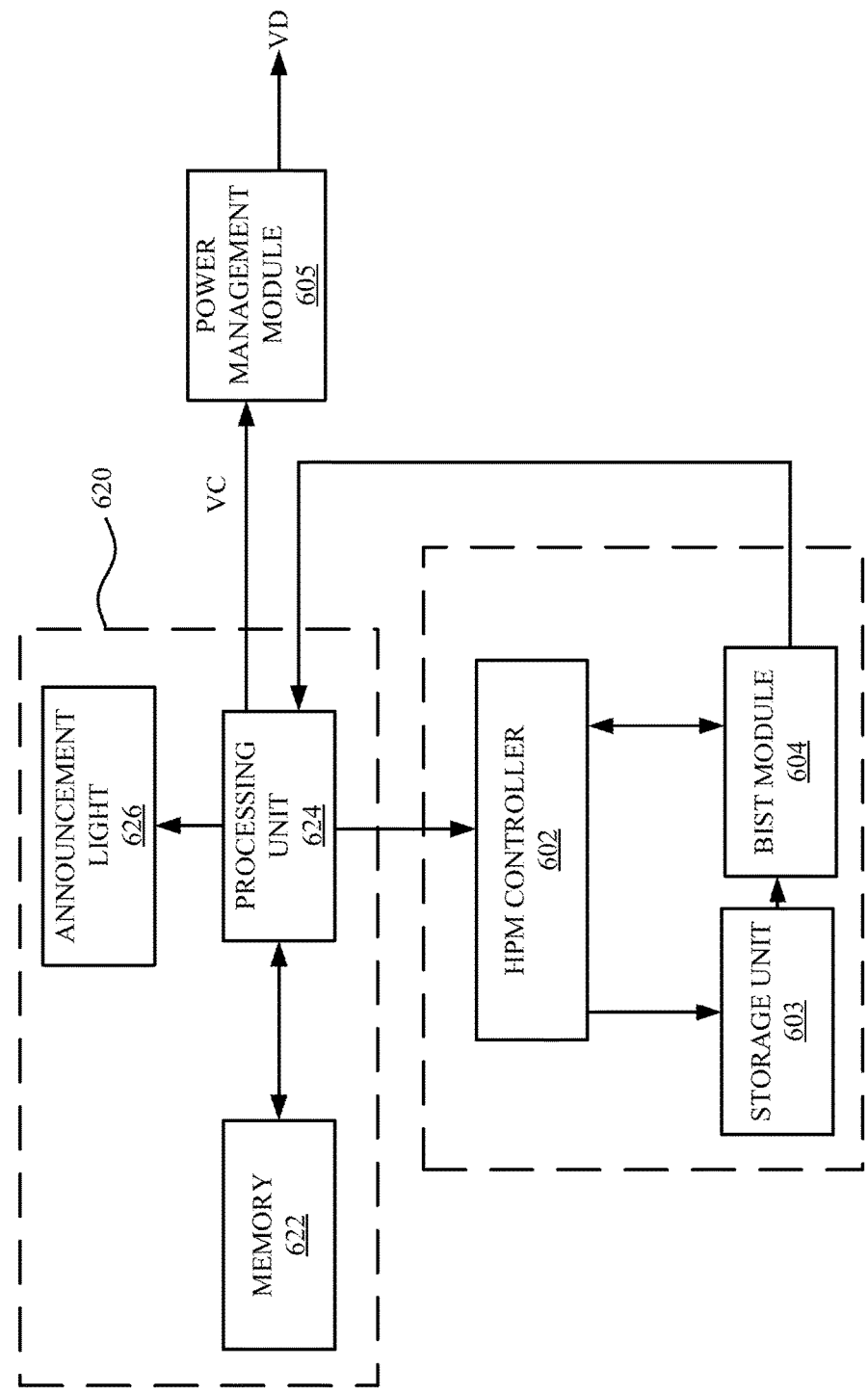
FIG. 6B is a schematic diagram of a voltage adjustment module according one embodiment of the present disclosure.

FIG. 6B is a schematic diagram of a voltage adjustment module according one embodiment of the present disclosure. Alternatively, in another embodiment, the voltage adjustment module 620 can be implemented with both of hardware and software. As shown in FIG. 6B, the voltage adjustment module 620 includes a memory 622, a processing unit 624, and an announcement light 626. The memory 622 is configured to store the performance table (i.e., table 2) and the weights of the performance function. The processing unit 624 is configured to receive the target value, and to generate the control signal VC according to the performance table and the target value, so as to adjust the power management module 606. The processing unit 622 can be a digital processor, a micro-controller, etc. The announcement light 626 includes a light-emitting diode (LED).

For illustration, when system is activated, the processing unit 624 enables the HPM(s) 601, the HPM controller 602, the storage unit 603, and the MST module 604, so as to obtain the counter values transmitted from the chips. The processing unit 624 determines whether the adjustment to the driving voltage VD generated from the power management module 605 is necessary according to the performance table and the counter values. After the driving voltage VD is adjusted, the processing unit 624 reads the counter values from the chips again. With the repetitious operation, when the counter value exceeds the target value, the processing unit 624 turns on the announcement light 626 to indicate that the driving voltage VD is completely adjusted.

For illustrative purpose, the above embodiment is illustrated with the chip 300A having a parallel arrangement, but the present disclosure is not limited thereto. The voltage automatic calibration system 600 can be applied to chips or integrated circuits having a parallel/series arrangement.

In summary, the binning system and the method for determining the performance of the present disclosure can determine the accurate performance of chips or integrated circuits. With the voltage calibration system, the variations or aging in the fabricated chips can be reduced, and thus the chips can have a more stable performance, and the unwanted power consumption can be saved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fail within the scope of the following claims.

What is claimed is:

1. A voltage automatic calibration system comprising:
   an integrated circuit, comprising a plurality of HPM(s) (hardware performance monitor), a storage unit configured to store a plurality of coefficients of a polynomial that defines a performance function of the integrated circuit, and a built-in self-test (BIST) module, wherein each HPM is configured to generate a value for generating a performance of the integrated circuit, each term of the polynomial comprises a corresponding one of the plurality of coefficients and an exponent of the value generated by a corresponding one of the plurality of HPM(s), the built-in self-test (BIST) module is electrically coupled to the storage unit and is configured to determine the performance of the integrated circuit by obtaining a value of the performance function of the integrated circuit according to the values of the HPM(s) and the plurality of coefficients in the storage unit;
   a power management module configured to generate a driving voltage to drive the integrated circuit according to a control signal; and
   a voltage adjustment module electrically coupled between the BIST module and the power management module, and the voltage adjustment module configured to generate the control signal by comparing the value of the performance function of the integrated circuit and a target value,
   wherein the integrated circuit is further configured to build a performance table, and the performance comprises information of the performance of the integrated circuit under different driving voltages,
   wherein the storage unit is implemented with at least one memory circuit, the BIST module is implemented with at least one first processing circuit, the power management module is implemented with a power management chip, and the voltage adjustment module is implemented with at least one second processing circuit.

2. The voltage automatic calibration system according to claim 1, wherein the voltage adjustment module is integrated in the integrated circuit, and the storage unit is further configured to store the performance table, wherein the voltage adjustment module generates the control signal by comparing the target value with the performance table.

3. The voltage automatic calibration system according to claim 1, wherein the voltage adjustment module comprises:
   a memory configured to store the performance table; and
   a processing unit configured to receive the target value, and to generate control signal according to the performance table and the target value.

* * * * *